United States Patent [19]
Ikeda et al.

[11] Patent Number: 5,175,839
[45] Date of Patent: Dec. 29, 1992

[54] STORAGE CONTROL SYSTEM IN A COMPUTER SYSTEM FOR DOUBLE-WRITING

[75] Inventors: Masayuki Ikeda; Koichi Ueda, both of Kawasaki, Japan

[73] Assignee: Fujitsu Limited, Kawasaki, Japan

[21] Appl. No.: 766,951

[22] Filed: Sep. 16, 1991

Related U.S. Application Data

[63] Continuation of Ser. No. 286,862, Dec. 20, 1988, abandoned.

[30] Foreign Application Priority Data

Dec. 24, 1987 [JP] Japan .................. 62-325437

[51] Int. Cl.⁵ .................................. G06F 12/00
[52] U.S. Cl. ...................... 395/425; 365/189.04; 371/10.1
[58] Field of Search ....... 365/189.04, 189.08, 365/201, 230.03; 395/425; 364/200, 900, DIG. 1, DIG. 2; 371/10.1, 10.2, 10.3, 14, 21.1, 40.1

[56] References Cited

U.S. PATENT DOCUMENTS

| | | | |
|---|---|---|---|
| 3,668,644 | 6/1972 | Looschen | 364/200 |
| 4,375,678 | 3/1983 | Krebs, Jr. | 365/238 |
| 4,404,647 | 9/1983 | Jones et al. | 364/900 |
| 4,656,614 | 4/1987 | Suzuki | 365/230 |
| 4,672,582 | 6/1987 | Nishimura et al. | 365/201 |
| 4,744,061 | 5/1988 | Takemae et al. | 365/201 |
| 4,783,731 | 11/1988 | Miyazaki | 364/200 |
| 4,882,708 | 11/1989 | Hayakawa et al. | 365/189.04 |
| 4,893,279 | 1/1990 | Rahman et al. | 365/230.03 |

FOREIGN PATENT DOCUMENTS 60-179983 9/1985 Japan .

OTHER PUBLICATIONS

English translation of Japanese Patent Appln. 56-58200 (May 21, 1981).
1986 Proceedings Fall Joint Computer Conference, Dallas, Tex., Nov. 2-6, 1986, pp. 1128-1137; R. F. Rashid: "From RIG to accent to mach: The evolution of a network operating system", p. 1132, col. 1, line 1-col. 2, line 37.
Patent Abstracts of Japan, vol. 6, No. 159 (p. 136), Aug. 20, 1982 for JP-A-57-074898 (NEC Corp.) May 11, 1982.
IBM Technical Disclosure Bulletin, vol. 27, No. 1A, Jun. 1984, p. 360, N.Y.; R. S. Capowski: "Dual storage system".
Patent Abstracts of Japan, vol. 5, No. 118 (p. 73, Jul. 30, 1981 for JP-A-56-058200 (NEC Corp.) May 21, 1981.
Patent Abstracts of Japan, vol. 8, No. 89 (p. 270), Apr. 24, 1984 for JP-A-59-003576 (Fujitsu K. K.), Jan. 10, 1984.
IBM Technical Disclosure Bulletin, vol. 14, No. 9, Feb. 1972, pp. 2811-2812, N.Y.; M. A. Auslander et al.: "Reducing memory contention and increasing reliability in multi-processors with dynamic address translation".
IBM Technical Disclosure Bulletin, vol. 18, No. 1, Jun. 1975, pp. 61-62, N.Y.: C. E. Hoff et al.: "Selective journaling".
European Search Report, The Hague, Oct. 23, 1990.

*Primary Examiner*—Michael R. Fleming
*Assistant Examiner*—Glenn A. Auve
*Attorney, Agent, or Firm*—Staas & Halsey

[57] ABSTRACT

In a computer system having at least a main storage unit and a memory control unit, a storage control system accesses two memory areas provided in the main storage unit, each of the two memory areas storing the same information. A double-writing device is provided in the memory control unit for writing the same information to each of the two memory areas by determining the state of a double-writing bit (D-bit) contained in an address order from a processor or the state of a storage configuration bit (F/S-bit) sent from the processor.

11 Claims, 4 Drawing Sheets

STORAGE CONTROL SYSTEM IN A COMPUTER SYSTEM FOR DOUBLE-WRITING

This application is a continuation of application Ser. No. 07/286,862, filed Dec. 20, 1988, now abandoned.

BACKGROUND OF THE INVENTION

1. Field of the Invention

The present invention relates to a storage control system ensuring the reliability of information stored in a computer system and, more particularly, it relates to a storage control system having double memories, a plurality of clusters, and double global storage units to ensure a reliable and high speed processing of information in the computer system.

2. Description of the Related Art

In a conventional computer system having at least a main storage unit (MSU), a memory control unit (MCU) and processors (CPU's), which stores information from an external stage in the main storage unit, the same information is written to two different areas in the main storage unit, to ensure the reliability of the stored data and to guard against an accidental fault occurrence in the memory (i.e., double-writing). In this case, the information is first stored to one area in the main storage unit, and then the same information is stored to another area in the same main storage unit. Therefore, even if the first stored information is destroyed by an accidental fault, the second stored information is maintained in the other area, and thus the reliability of the information stored in the memory can be ensured.

In the conventional computer system, however, the overall time necessary for storing the information in each of the memory areas in the main storage unit is doubled, and accordingly, this conventional method impedes a high speed processing in the computer system.

A computer system constituted by a plurality of processors (i.e., a multiprocessor system) is known, wherein the plurality of processors is divided into a plurality of groups, each of which is called a "cluster", for a cluster control, and control of an access between processors is performed through each cluster and the global storage unit, for a high speed processing of the information. Accordingly, the multiprocessor system is constituted by a plurality of clusters and the global storage unit, and each cluster comprises a local storage unit, a memory control unit and, for example, four processors operatively connected to the memory control unit.

In the multiprocessor system, the double-writing of the information in the memory must be used to ensure the reliability of the stored information.

Nevertheless, it is impossible to ensure both a high reliability and a high speed processing of the information in the conventional computer system.

SUMMARY OF THE INVENTION

The object of the present invention is to provide a storage control system in a computer system enabling a high speed storing of the same write data to each of two areas in a main storage unit, to ensure the reliability of the information.

In accordance with the present invention, there is provided a storage control system in a computer system having at least a main storage unit and a memory control unit, the storage control system comprising: two memory areas provided in the main storage unit, each of the two memory areas storing the same information; and a double-writing device provided in the memory control unit for writing the same information to each of the two memory areas by discriminating a state of a double-writing bit (D-bit) contained in an address order from a processor or a state of a storage configuration bit (F/S-bit) sent from the processor.

The D-bit is used for a non-privileged mode and takes two states; a state of "0" representing a normal writing mode for writing the information to one of the two memory areas, and the state of "1" representing a double-writing mode for writing the same information to each of the two memory areas.

The F/S-bit is used for a privileged mode and takes four states in accordance with four sets of the F-bit and the S-bit.

Further, there is provided a storage control system in a multiprocessor system having a plurality of processors divided into a plurality of clusters, and having two global storage units, each of the clusters further having a memory control unit and a local storage unit, the storage control system comprising: two memory areas provided in the global storage units, each of the two memory areas storing the same information; and a double-writing device provided in the memory control unit for writing the same information to each of the two memory areas by discriminating a state of a double-writing bit (D-bit) contained in an address order from the processor or a state of a storage configuration bit (F/S-bit) sent from the processor.

DESCRIPTION OF THE PREFERRED EMBODIMENTS

Figure 1:
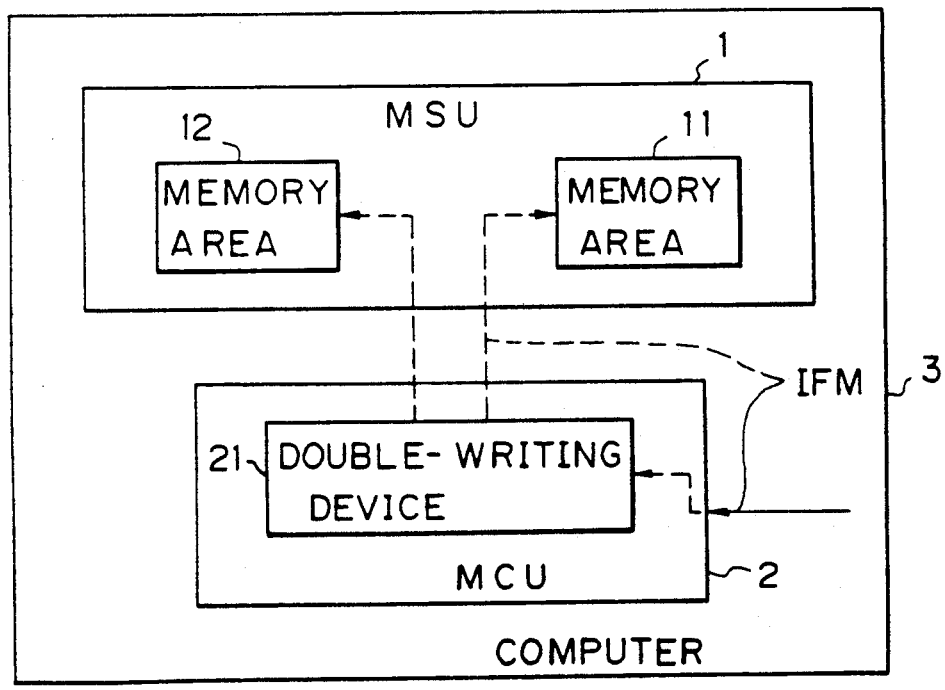
FIG. 1 is a block diagram of the basic structure of a storage control system according to the present invention.

FIG. 1 shows the basic structure of a storage control system according to the present invention. In FIG. 1, reference number 1 represents a main storage unit (MSU) having two memory areas 11 and 12, reference numeral 2 represents a memory control unit, (MCU) having a double-writing device 21, and reference numeral 3 represents a computer system including these units. The memory control unit 2 controls the reception of information IFM from the external stage to the double-writing device 21. The double-writing device 21 is provided for simultaneously storing the same information IFM to the two different areas 11, 12 in the main storage unit 1.

According to the present invention, since the same information can be written simultaneously to two different areas in the main storage unit, it is possible to reduce the writing time and ensure the reliability and high speed processing of the information in the computer system.

Figure 2:
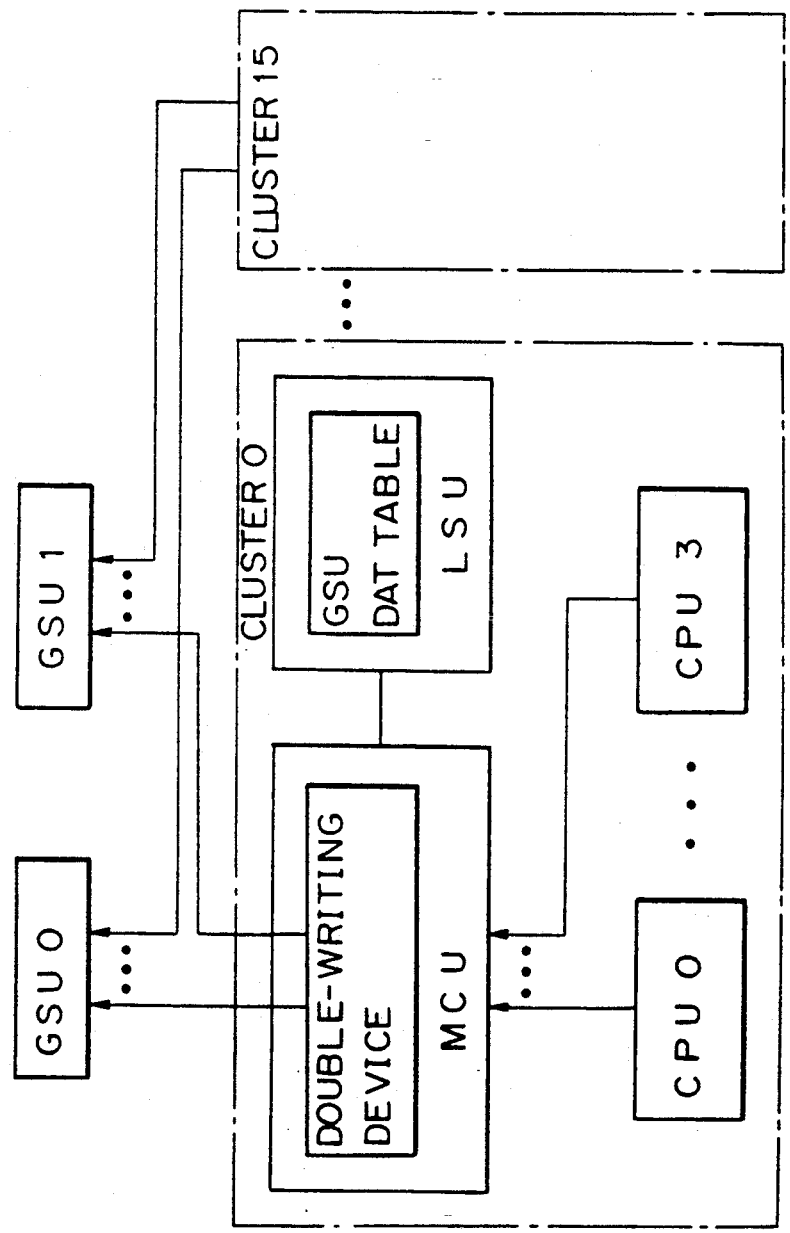
FIG. 2 is a schematic block diagram of a multiprocessor system according to an embodiment of the present invention.

FIG. 2 is a schematic block diagram of a multiprocessor system according to an embodiment of the present invention. In FIG. 2, the multiprocessor system is constituted by sixty-four processors, which are divided into sixteen clusters each having four processors CPU0 to CPU3. Each cluster comprises four processors CPU0 to CPU3, a local storage unit LSU, and a memory control unit MCU, and is connected in common to two global storage units GLU0 and GSU1 through bus lines BUS. The global storage units include the memory areas corresponding to the main storage unit 1 shown in FIG. 1. The local storage unit LSU comprises a DAT (Dynamic Address Translator) table for address conversion. The DAT-table is used for converting a virtual address to a real address complying with each global storage unit GSU0 to GSU1. Further, the memory control unit MCU comprises a double-writing device DWD for simultaneously storing the same information to each of the global storage units GSU0 and GSU1 in response to an order from the processors CPU0 to CPU3.

The double-writing device DWD does not always store the information to two global storage units GSU0 and GSU1; i.e., in a non-privileged mode and in a cluster performing execution using a virtual address, the transfer of information between the global storage unit GSU and the DAT table belonging to that cluster can be controlled in accordance with a state of a D-bit representing a double-writing mode. For example, when the D-bit is "0", one global storage unit (for example, GSU0) is accessed, and when the D-bit is "1", two global storage units GSU0 and GSU1 are accessed simultaneously.

In a privileged mode, an operation is executed by an access order using the real address. In this case the DAT table is not used and transfer for the writing is controlled in accordance with the state of two kinds of storage configuration bits (F/S-bits; first and second bits) generated from the processor, as shown by a following F/S table.

| F-bit | S-bit | F/S table control of writing |
|---|---|---|
| 1 | 1 | write to both GSU0 and GSU1 |
| 1 | 0 | write to only GSU0 |
| 0 | 1 | write to only GSU1 |
| 0 | 0 | exception of address designation |

The term "exception of address designation" means that no area to be accessed can be found.

Figure 3:
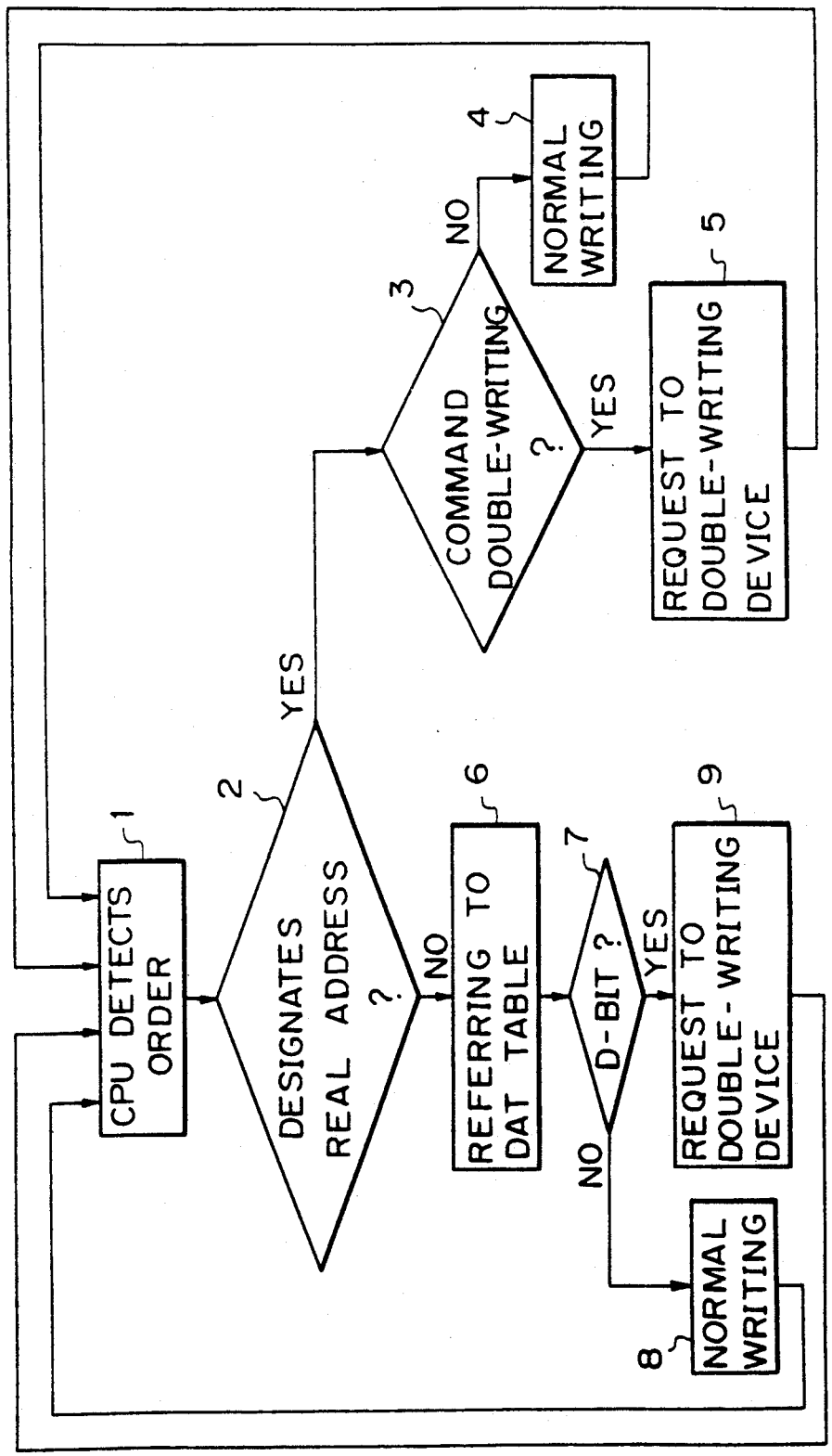
FIG. 3 is a flowchart of a double-writing process according to an embodiment of the present invention.

FIG. 3 is a flowchart explaining an operation of the storage control system according to an embodiment of the present invention. In FIG. 3, when the processor CPU detects an order (step 1), the processor CPU determines whether or not the order designates the real address of the global storage unit GSU (step 2). When the order designates the real address (YES), the processor CPU sends the order to the memory control unit MCU without referring the DAT table. The memory control unit MCU then determines whether or not the order is a double-writing order by referring to the command of the order (step 3). When the order is not a double-writing order (NO), the memory control unit MCU executes a normal writing (step 4), and when the order is a double-writing order (YES), the memory control unit MCU sends a request for a double-writing to the double-writing device DWD by referring to the F/S table (step 5).

Further, when the order does not designate the real address, as shown by "NO" in step 2, the processor CPU refers to the DAT table and the designation of the address is converted to the real address of the GSU0 (step 6). The memory control unit MCU determines the state of the D-bit designating the double-writing (step 7), and when the D-bit is zero, the memory control unit MCU executes a normal writing (step 8). When the D-bit is one, the memory control unit sends a request for a double-writing to the double-writing device by referring to the F/S table (step 9).

In this case, when the double-writing device receives the double-writing request from the memory control unit, it automatically generates the double-writing address for one global storage unit corresponding to the writing address for the other global storage unit designated, and simultaneously, transfers the writing request to both global storage units. Therefor, according to the present invention, it is possible to store the information to be written to two global storage units based on a one-time writing operation, and thus it is possible to achieve a high speed processing of the information and to ensure the reliability of the stored information.

Figure 4:
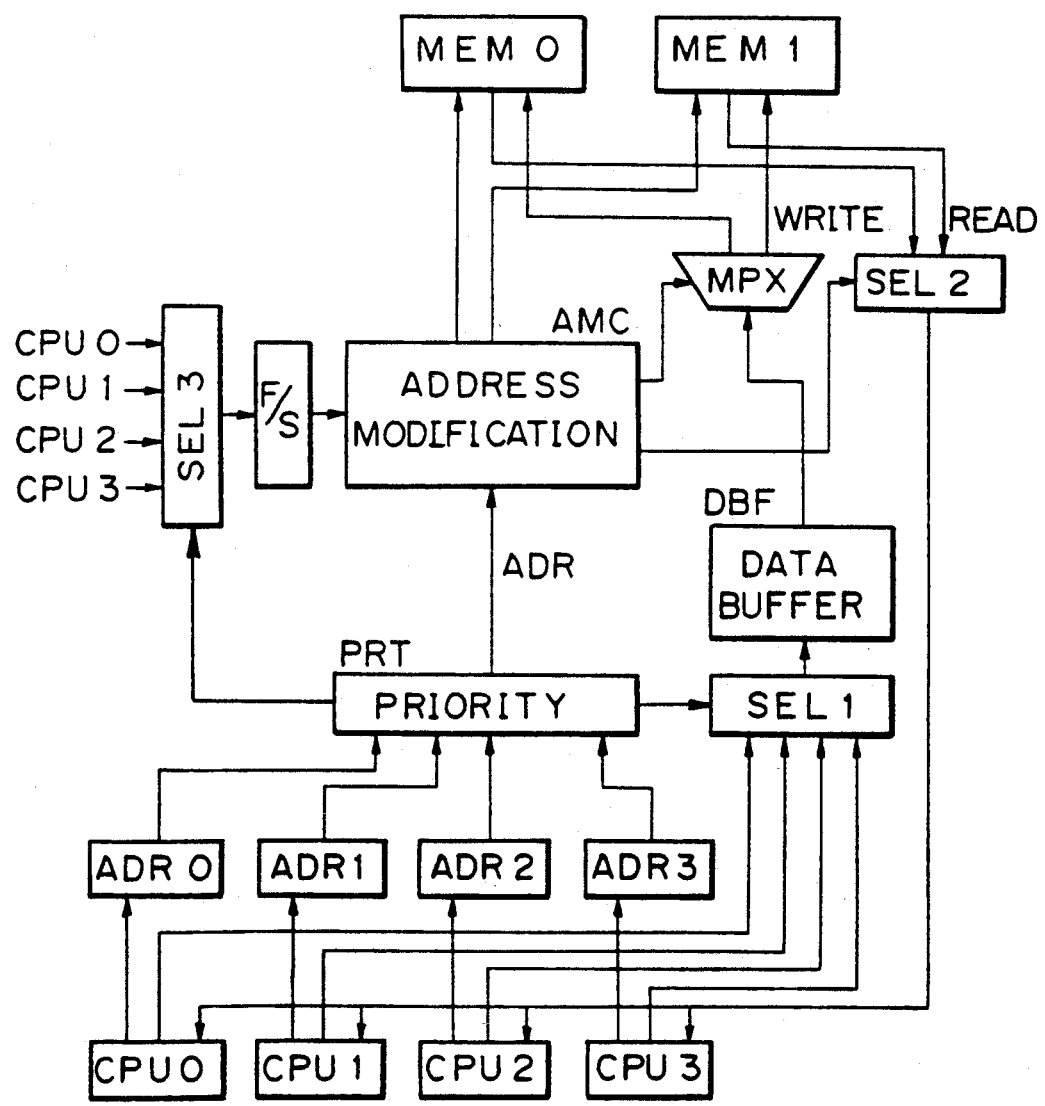
FIG. 4 is a schematic block diagram of a memory control unit according to an embodiment of the present invention.

FIG. 4 is a schematic block diagram of the memory control unit according to an embodiment of the present invention. In FIG. 4, address translators ADR0 to ADR3 are provided at corresponding processors CPU0 to CPU3, and each of the memories MEM0 and MEM1 is included in corresponding global storage unit GSU0 or GSU1. Namely, for example, the memory MEM0 is included in the global storage unit GSU0 and the memory MEM1 is included in the global storage unit GSU1. The memory control unit comprises a priority circuit PRT, selectors SEL1 and SEL2, an address modification circuit AMC, a data buffer DBF, a multiplexer MPX, and an F/S-bit table. The double-writing device according to the present invention corresponds to the address modification circuit AMC and the F/S-bit table.

In this structure, for example, the order from the processor CPU1 is input to the address translator ADR1, and when the order designates the real address, it is sent to the priority circuit PRT without a conversion of the address. When the order designates the virtual address, the virtual address is converted to the real address by referring to the DAT table. The priority circuit PRT determines the priority for the orders input from each of address translators ADR0 to ADR3, and the order selected by the priority circuit PRT is sent to the address modification circuit AMC and the first selector SEL1.

The address modification circuit AMC determines whether or not the D-bit is high ("1"), to detect the double-writing mode in the non-privileged mode. When the D-bit is low ("0"), the normal writing mode is executed for the memory through the multiplexer MPX. In this case, the data is transferred from the processor to the memory through the selector SEL1, the data buffer DBF, and the multiplexer MPX. When the D-bit is high, the double-writing mode executed to write to two areas of the memory.

In the privileged mode, the address modification circuit AMC makes a determination based on the state of the F/S-bit. Namely, as shown by the F/S table above, the data is written to the GSU0 and/or GSU1 in accordance with the F/S table, through the multiplexer MPX. The F/S-bit is determined by the processor selected by the priority circuit PRT through the selector SEL3. The selector SEL2 is provided for reading the data from the memory MEM0 or MEM1 to the processor.

What is claimed is:

1. A storage control system in a computer system having at least a processor, a main storage unit and a memory control unit, said storage control system comprising:

access means, operatively connected to the processor and the main storage unit, for accessing two memory areas provided in said main storage unit, each of said two memory areas storing identical information; and double-writing means, provided in said memory control unit and operatively connected to the processor and said access means, for writing the identical information to each of said two memory areas using said access means, by determining a state of one of a double-writing bit (D-bit) contained in an address order from the processor and a storage configuration bit (F/S-bit) stored in the memory control unit, said D-bit being used for a non-privileged mode and having two possible states, a first state of "0" representing a normal writing mode to write information to only one of said two memory areas, and a second state of "1" representing a double-writing mode to write the identical information to each of said two memory areas.

2. A storage control system in a computer system having at least a processor, a main storage unit and a memory control unit, said storage control system comprising:

access means, operatively connected to the processor and the main storage unit, for accessing two memory areas provided in said main storage unit, each of said two memory areas storing identical information; and double-writing means, provided in said memory control unit and operatively connected to the processor and said access means, for writing the identical information to each of said two memory areas using said access means, by determining a state of one of a double-writing bit (D-bit) contained in an address order from the processor and storage configuration bits sent from the processor, said storage configuration bits being used for a privileged mode and having four possible states in accordance with four permutations of an F-bit and an S-bit.

3. A storage control system in a multiprocessor system having a plurality of processors divided into a plurality of clusters and two global storage units, each of said clusters having a memory control unit and a local storage unit, said storage control system comprising:

access means, operatively connected to the memory control units in each cluster and the global storage units, for accessing two memory areas provided in each of said global storage units, each of said two memory areas storing identical information; and double-writing means, provided in said memory control unit and operatively connected to said access means, for writing the identical information to each of said two memory areas using said access means, by determining a state of one of a double-writing bit (D-bit) contained in an address order from one of the processors and at least one storage configuration bit sent from the one of the processors.

4. A storage control system as claimed in claim 3, wherein said D-bit is used for a non-privileged mode and has two possible states, a first state of "0" representing a normal writing mode to write information to only one of said two memory areas, and a second state of "1" representing a double-writing mode to write the identical information to each of said two memory areas.

5. A storage control system as claimed in claim 3, wherein the at least one storage configuration bit is used for a privileged mode and includes an F-bit and an S-bit, together having four possible states.

6. A storage control system in a multiprocessor system having a plurality of processors divided into a plurality of clusters and two global storage units, each of said clusters having a memory control unit and a local storage unit, said storage control system comprising:

access means, operatively connected to the memory control units in each cluster and the global storage units, for accessing two memory areas provided in each of said global storage units, each of said two memory areas storing identical information;

double-writing means, provided in said memory control unit and operatively connected to said access means, for writing the identical information to each of said two memory areas using said access means, by determining a state of one of a double-writing bit (D-bit) contained in an address order from one of the processors and at least one storage configuration bit sent from the one of the processors; and a dynamic address translator in said local storage unit and operatively connected to said double-writing means for converting a virtual address to a real address.

7. A storage control system in a multiprocessor system having a plurality of processors divided into a plurality of clusters and two global storage units, each of said clusters having a memory control unit and a local storage unit, said storage control system comprising:

access means, operatively connected to the memory control units in each cluster and the global storage units, for accessing two memory areas provided in each of said global storage units, each of said two memory areas storing identical information;

double-writing means, provided in said memory control unit and operatively connected to said access means, for writing the identical information to each of said two memory areas using said access means, by determining a state of one of a double-writing bit (D-bit) contained in an address order from one of the processors in a corresponding cluster and at least one storage configuration bit sent from the one of the processors;

an F/S-bit table in said memory control unit, operatively connected to the processors in the corresponding cluster and selected by the one of the processors; and an address modification circuit in said memory control unit, operatively connected to said F/S-bit table and the global storage units, determining one of a normal writing mode and a double-writing mode based on the state of the D-bit in a non-privileged mode and the at least one storage configuration bit in a privileged mode.

8. A storage control system in a memory control unit of a computer system also including a main storage and at least one processor sending control data to said storage control system, the control data including indication of whether a non-privileged access mode is used, said storage control system comprising:

address means, operatively connected to the at least one processor, for receiving a first write address for data received from the at least one processor; and double-write means, operatively connected to the at least one processor and the main storage, for simultaneously writing identical data to more than one area in the main storage in dependence upon a double-write signal from the at least one processor indicating when said double-write means is to write the identical data to the more than one area in the main storage, said double-write means including address modification means for generating a second write address in the main storage in dependence upon the first write address received by said address means, when the double-write signal indicates that the identical data is to be written to the more than one area in the main storage.

9. A storage control system in a memory control unit of a computer system also including a main storage and at least one processor sending control data to said storage control system, said storage control system comprising:

address means, operatively connected to the at least one processor, for receiving a first write address for data received from the at least one processor; and double-write means, operatively connected to the at least one processor and the main storage, for simultaneously writing identical data to more than one area in the main storage in dependence upon a double-write signal from the at least one processor indicating when said double-write means is to write the identical data to the more than one area in the main storage and the control data from the at least one processor including an indication of whether a non-privilege access mode is used and a storage configuration signal indicating areas of the main storage to be written to in a privilege mode, said double-write means including address modification means for generating a second write address in the main storage in dependence upon the first write address received by said address means, when the double-write signal indicates that the identical data is to be written to the more than one area in the main storage.

10. A storage control system as claimed in claim 9, wherein said memory control unit further comprises a storage configuration table, operatively connected to the at least one processor for determining the areas of the main storage indicated by the storage configuration signal, and wherein said address modification means generates the second write address in the privilege mode in dependence upon the areas of the main storage determined by said storage configuration table.

11. A storage control system as claimed in claim 10, further comprising:

a data buffer for receiving the data from the processor; and means for supplying the data from said data buffer to the areas of the main storage under control of said address modification means.

* * * * *